United States Patent [19]
Saunders

[11] Patent Number: 6,075,423
[45] Date of Patent: Jun. 13, 2000

[54] CONTROLLING SIGNAL TRACE CHARACTERISTIC IMPEDANCE VIA A CONDUCTIVE EPOXY LAYER

[75] Inventor: Gary S. Saunders, Folsom, Calif.

[73] Assignee: Intel Corporation, Santa Clara, Calif.

[21] Appl. No.: 08/979,997

[22] Filed: Nov. 26, 1997

[51] Int. Cl.[7] ............................... H01P 3/08; H01P 5/02; H05K 1/18

[52] U.S. Cl. ..................... 333/33; 333/238; 333/247; 174/250; 174/260; 257/664; 257/728; 361/736; 361/748; 29/846

[58] Field of Search ..................................... 333/238, 246, 333/247, 33; 361/736, 748, 760, 761, 792, 795; 174/260, 262, 250, 251; 257/664, 700, 728, 774, 776; 29/846

[56] References Cited

U.S. PATENT DOCUMENTS

| | | | |
|---|---|---|---|
| 4,890,155 | 12/1989 | Miyagawa et al. | 257/664 X |
| 4,904,968 | 2/1990 | Theus | 333/246 |
| 4,991,001 | 2/1991 | Takubo et al. | 333/247 X |
| 5,061,824 | 10/1991 | Alexander et al. | 333/246 X |
| 5,115,217 | 5/1992 | McGrath et al. | 333/246 |
| 5,177,324 | 1/1993 | Carr et al. | 361/761 X |
| 5,410,179 | 4/1995 | Kornrumpf et al. | 257/638 |
| 5,528,202 | 6/1996 | Moline et al. | 333/246 X |
| 5,675,299 | 10/1997 | Suski | 333/238 X |
| 5,768,109 | 6/1998 | Gulick et al. | 333/247 X |
| 5,818,315 | 10/1998 | Moongilan | 333/238 |

FOREIGN PATENT DOCUMENTS

| | | | |
|---|---|---|---|
| 63-144603 | 6/1988 | Japan | 333/238 |
| 63-238701 | 10/1988 | Japan | 333/238 |
| 3-120851 | 5/1991 | Japan | 333/247 |
| 5-29808 | 2/1993 | Japan | 333/247 |

OTHER PUBLICATIONS

"EMI Shielding Using CB Series Polymer Thick Film Design Guidelines", *DuPont Electronic Materials*, Oct. 1996.

"High–Speed Digital Design—A Handbook of Black Magic," by Howard W. Johnson and Martin Graham, Prentice–Hall (1993), pp. 430–435.

MECL System Design Handbook, 4th Ed., 2nd Printing, Motorola, Inc., 1983, pp. 44, 45, 48.

High Speed PC Band System Design (class), Part of University of California at Berkeley Site Training Program, by Lee W. Ritchey, Ritch Tech, Apr. and Sep. 1997.

*Primary Examiner*—Benny Lee
*Assistant Examiner*—Barbara Summons
*Attorney, Agent, or Firm*—Blakely, Sokoloff, Taylor, Zafman LLP

[57] ABSTRACT

A conductive ground layer provides a low cost method of reducing, controlling, or tailoring printed circuit board (PCB), for example, a motherboard, trace impedance and/or size, cross-talk, and EMI without having to add additional layers. A thin layer of conductive epoxy is applied over a solder mask high speed signal trace area of the PCB. The conductive epoxy is connected to or coupled to a ground plane or layer of the PCB. The inclusion of a higher number of traces on the PCB is made possible by tailoring the characteristic impedance of the traces, which allows the trace size to be reduced.

24 Claims, 4 Drawing Sheets

US 6,075,423

CONTROLLING SIGNAL TRACE CHARACTERISTIC IMPEDANCE VIA A CONDUCTIVE EPOXY LAYER

BACKGROUND OF THE INVENTION

1. Field of the Invention

This invention relates generally to a printed circuit board ("PCB"), and more particularly, to impedance and trace size in PCBs.

2. Description of the Related Art

As chip size continues to be reduced and signals are clocked at ever increasing frequencies, high-speed, high-frequency signals being driven between chips via traces (channels) on a printed circuit board ("PCB") may be subject to detrimental impedance effects. One manifestation of these impedance effects is unwanted reflections due to impedance mismatches. The high-speed, high-frequency signals may also be prone to cross-talk and electromagnetic interference ("EMI"). To help reduce such effects, high-speed signal traces have been routed through the middle of the PCB in layers between power and ground planes. Layers may have to be switched and trace width changed. For example, a 6-layer PCB could be employed to bury the traces instead of a four-layer PCB. Routing traces in this manner could add a cost of $10–$30 per board due to the additional layers needed to provide route paths.

The size of the trace is another parameter affecting impedance, as manifested in, for example, the characteristic impedance of the trace. Characteristic impedance generally decreases with increasing trace surface area (or with trace width). For example, for an approximately 1.4 mil thick trace on a four-layer PCB to have a characteristic impedance as low as 25 ohms, the trace may have to be as wide as approximately 30 mils. Therefore, when, building a conventional four-layer PCB, it may not be possible to reduce characteristic impedance from, for example, 60–80 ohms down to 25 ohms using narrower traces. This may present a problem if a narrow trace having reduced trace characteristic impedance is required for a specific implementation. Moreover, a wide trace may use too much PCB area (real estate) in certain implementations.

Thus, there is a need to reduce, control, or tailor impedance in PCBs while also avoiding the use of overly wide traces. Such control could reduce cross-talk and lessen the effects of EMI as well.

SUMMARY OF THE INVENTION

In one aspect of the present invention, an apparatus that exhibits controlled characteristic impedance is provided. The apparatus includes: (1) a multilayered circuit board having a signal trace; and (2) a conductive layer comprising a limited region on the multilayer circuit board proximate to and offset from the signal trace, and coupled to control characteristic impedance.

In another aspect of the invention, a method of tailoring multilayer circuit board signal trace characteristic impedance using a conductive coating to reduce signal trace size for a given characteristic impedance is provided. The method includes coating the conductive coating over a limited region of the multilayer circuit board proximate the signal trace to reduce the characteristic impedance of the signal trace.

BRIEF DESCRIPTION OF THE DRAWINGS

Other objects and advantages of the invention will become apparent upon reading the following detailed description and upon reference to the drawings in which.

Figure 1:
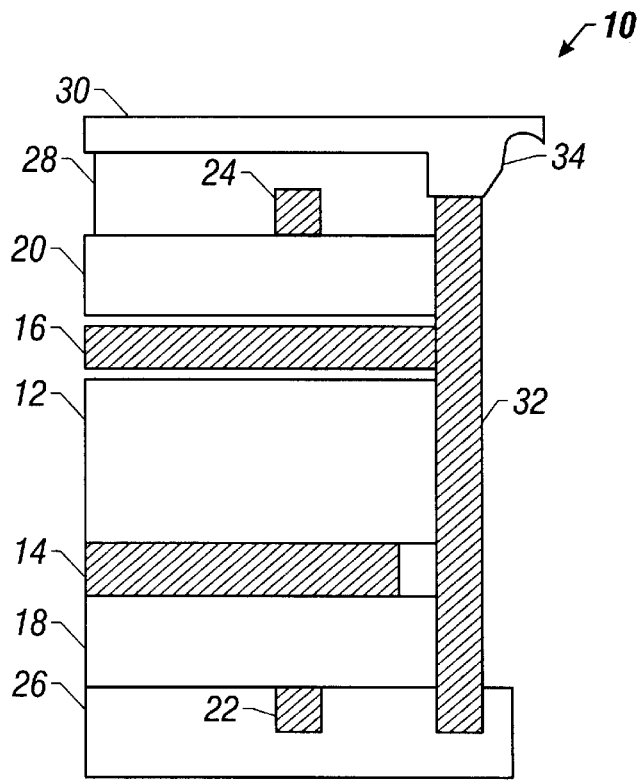
FIG. 1 is a cross-sectional representation of a PCB in accordance with an embodiment of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 is a cross-sectional representation of a PCB (or multilayered circuit board) 10 in accordance with an embodiment of the invention. The PCB 10 may be a four-layer computer board, for example, a motherboard, but could be other types of PCBs, or could have a different number of layers. The PCB 10 includes a non-conducting core layer 12 adjacent to or layered between a conductive power layer 14 and a conductive ground plane or layer 16, each having respective adjacent or being layered on prepreg layers 18 and 20 (e.g., dielectric material, such as a fiberglass "cloth" or matte having impregnated resin). The core layer 12 may be, for example, a standard FR4 fiberglass core having copper or another conductor on its surface. Other types of core material could also be used, for example, polyimide. The prepreg layers 18 and 20 are adjacent to or layered on conductive traces 22 and 24, and solder mask layers 26 and 28, respectively. The solder mask layers 26 and 28 and the prepreg layers 18 and 20 embed the traces 22 and 24 disposed between them, respectively. The conductive traces 22 and 24 may be high-speed, high-frequency signal traces and the solder mask layers 26 and 28 cover and protect the traces 22 and 24 from oxidation. The solder mask layers 26 and 28 are a non-conductive material, for example, dielectric material, such as a photo-imageable insulative material or a non-conducting epoxy. A conductive coating layer 30 (e.g., a conductive epoxy) may be adjacent to or layered on the solder mask 28 proximate the location of the trace 24. Examples of conductive epoxy that may be used for the conductive layer 30 include DuPont CB200 Copper (Cu) Conductor and CB025 Silver (Ag) Conductor. These conductive epoxies are referred to as polymer thick film ("PTF"). Other materials or epoxies that include aluminum (Al) or other metals could be used for the conductive layer 30. Application or layering of the conductive layer 30 may be accomplished by silk screen, stencil, roll on, paint, spray, etc., or other methods.

The PCB 10 also includes a ground via 32, which passes through a conductive through-hole 34 and is coupled to the ground layer 16. The conductive layer 30 also makes conductive contact with the ground via 32. Good conductive contact between the ground via 32, the ground layer 16, and the conductive layer 30 keeps them at a common, or at an approximately common, electrical potential.

The structure and dielectric properties of the PCB 10 will have a bearing on impedance effects in the PCB 10. For example, the uniformity of the thickness of the solder mask 28 may be an important factor in determining the trace 24 characteristic impedance. Control of the solder mask layer 28 thickness within a tolerance should help provide a uniform characteristic impedance of the trace 24 in accordance with a given specification. One method of controlling the solder mask 28 thickness could be to spin apply the solder mask 28 on a turntable, similar to the application of photoresists for photolithography. Fine control of the solder mask 28 thickness may be required to maintain thickness uniformity. Moreover, the presence of the conductive layer 30 on, and the quality of its adhesion to, the solder mask layer 28 may also affect the characteristic impedance of the trace 24. For example, in accordance with an embodiment of the invention, the presence of the conductive layer 30 may allow the characteristic impedance of the trace 24 to be reduced, controlled, or tailored for a given trace size than would otherwise be possible without the conductive layer 30 unless the trace size was much larger. Cross-talk and EMI may also be reduced, as mentioned above. In general, lower characteristic impedance lowers cross-talk. The reduction in characteristic impedance is brought about by the formation of a distributed capacitance (i.e., a "capacitor") between the added conductive layer 30 and the conductive trace 24, with the conductive layer 30 acting as one of the capacitor plates and the trace 24 acting as the other. The solder mask 28 constitutes the dielectric material within the capacitor. The presence of this distributed capacitance increases the capacitance in the PCB 10, which effectively reduces the characteristic impedance of the trace 24.

The addition of the conductive layer 30 also allows for PCB 10 designs where the width of the trace 24 may be reduced for a given characteristic impedance. The size of the trace 24 may be reduced while a characteristic impedance of a trace of larger size, but not having an offset conductive layer, is maintained, in accordance with another embodiment of the invention. Reducing trace size could therefore allow an increased number of traces, like trace 24, at lower characteristic impedance than otherwise might be possible without larger traces on the PCB 10. For example, the PCB 10 could be designed and constructed with smaller traces, but with the same trace-to-trace spacing and characteristic impedance of larger traces.

To understand the foregoing, a straightforward approach is to recognize that the trace 24, the solder mask 28, and conductive layer 30, besides forming a distributed capacitance, also form what is termed a buried transmission line, in particular, a buried asymmetric stripline transmission line. Buried transmission line impedance and signal transmission characteristics are known in the art. A comparison may be made between the characteristic impedance of a buried transmission line, like the trace 24, and a transmission line not having an offset conductive layer, like the conductive layer 30. The comparison will show that the width of the trace 24 may be reduced compared to a trace lacking the offset conductive layer 30 for a given characteristic impedance. Likewise, the same approach could be used to show that the characteristic impedance of the trace 24 may be reduced, for a given trace 24 width, compared to a trace lacking the offset conductive layer 30, but having the same width. Either approach is included within the scope of the present invention.

Figure 2:
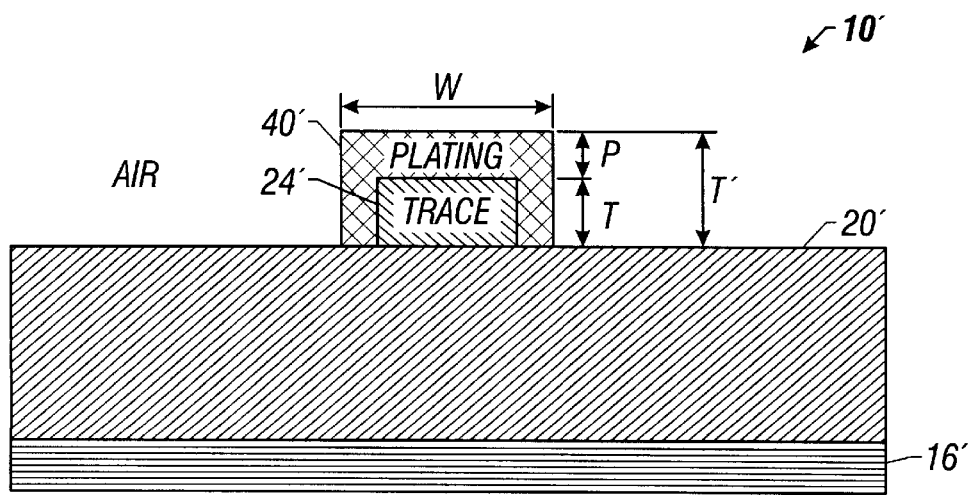
FIG. 2 is a cross-sectional representation of a portion of a PCB.

To begin the comparison, reference is made to FIG. 2, which is a cross-sectional representation of a portion of a four-layer PCB 10' including a trace 24', but without an offset conductive layer. The PCB 10', which forms what is termed a microstripline or microstrip transmission line, also does not include a solder mask layer. The characteristic impedance of the microstrip transmission line is also known in the art (see, for example, *High-Speed Digital Design: A Handbook of Black Magic*, by Howard W. Johnson and Martin Graham, Prentice-Hall [1993] which is incorporated herein by reference in its entirety), and is given by Eqs. 1–3 below:

$$Z_{o\,microstrip} = \frac{120\pi}{\sqrt{\varepsilon r_{\mathit{eff}}}\left[\frac{T_{\mathit{eff}}}{H} + 1.393 + 0.667\ln\left[\frac{T_{\mathit{eff}}}{H} + 1.444\right]\right]}, \quad (1)$$

where $$T_{\mathit{eff}} = W + \frac{1.25T'}{\pi}\left[1 + \ln\left(\frac{2H}{T}\right)\right] \quad (2)$$

and $$\varepsilon_{\mathit{reff}} = \frac{\varepsilon_r + 1}{2} + \left[\frac{\varepsilon_r - 1}{2}\right]\left[1 + \frac{12H}{W}\right]^{-1/2} - \frac{(\varepsilon_r - 1)\frac{T}{H}}{4.6\sqrt{\frac{W}{H}}}. \quad (3)$$

In FIG. 2 and Eqs. 1–3, the trace 24' has a width "W," a thickness "T," and includes a plated overlayer 40' that has a thickness "P" and is exposed to air. It is assumed that the width of the plated layer 40' on either side of the trace 24', as illustrated in FIG. 2, contributes negligibly to the width W. The plated layer 40' is typically a tin-lead-nickel composition and is included in the structure shown in FIG. 2 to prevent oxidation of the trace 24', which is typically copper. The trace 24' is layered on a dielectric layer 20' (e.g., prepreg material), which, in turn, is layered on a reference plane 16' (e.g., a ground plane). $T_{\mathit{eff}}$ is the effective thickness of the trace 24', "T'" is the sum of the thicknesses of the trace 24' and the plated layer 40' (i.e., T'=T+P is the overall thickness of the trace 24 in the microstrip transmission line), "H" is the thickness of the dielectric layer 20', $\varepsilon_{r_{\mathit{eff}}}$ is the trace 24' geometry-dependent effective dielectric constant, and $\varepsilon_r$ is the dielectric constant of the dielectric layer 20'.

Various dimensions and dielectric material properties are assumed for the calculation with Eqs. 1–3. For example, the assumptions may be: the length of the trace 24' (not shown in the drawings, but perpendicular to T and W) is 1 inch; the thickness T of the trace 24' (e.g., Cu) is 0.5 ounce (~0.7 mils); the thickness P of the plated layer 40' (e.g., Sn—Pb—Ni) is 0.5 ounce (~0.7 mils), the thickness H of the dielectric layer 20' (e.g., prepreg) is 6 mils; and the dielectric constant ($\varepsilon_r$) is 4.3. From these assumptions, the total thickness of the trace 24' and plated layers 40' (i.e., T') used in the calculation is approximately 1.4 mils. Other non-oxidizing conductive materials could be used instead of Cu for the trace 24', in which case, the plated layer 40' may not be required. In such a circumstance, the total thickness T of the trace 24' alone would be assumed to be approximately 1.4 mils.

Using Eqs. 1–3 and the above assumptions, if a desired characteristic impedance $Z_0$ at 1 MHz is 25 ohms, a value of approximately 25.0 ohms may be obtained for the trace 24' for a 30 mil trace width W. Other calculations known in the art may be used to show that, for the microstrip (i.e., the trace 24'), signal delay is 160.9 ps, inductance "L" is 4.0 nH, capacitance "C" is 6.4 pF, and resistance per inch of length "R" is 0.017 ohms. It should be understood that, although the trace 24' has been assumed to be exposed to air (see FIG. 2), if it were instead embedded within a solder mask layer, the results of the above calculations would not change significantly.

Figure 3:
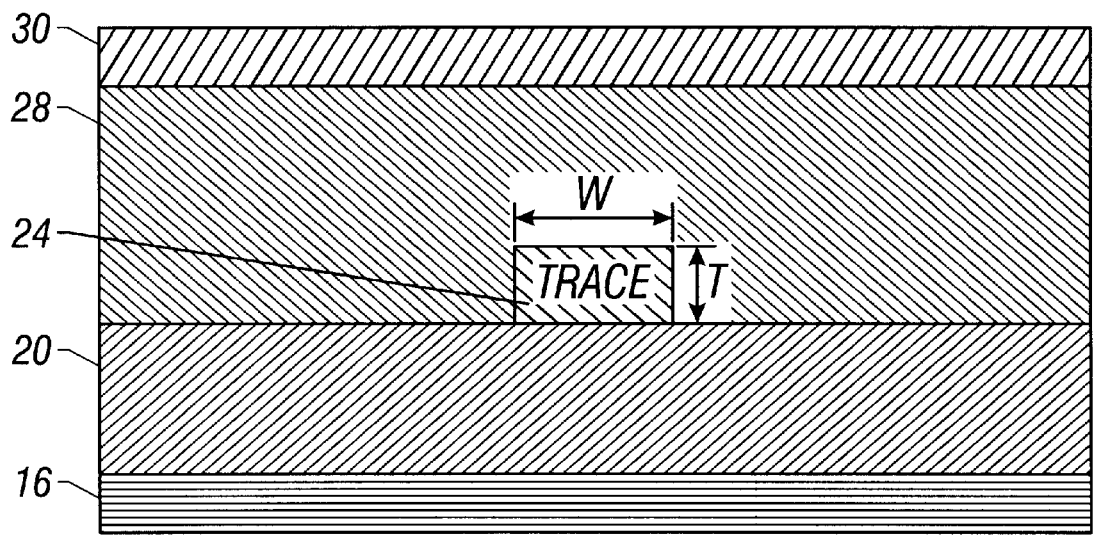
FIG. 3 is a cross-sectional representation of a portion of a PCB in accordance with the embodiment of the invention in FIG. 1.

On the other hand, for the PCB 10 asymmetric stripline buried transmission line, including the trace 24, the configuration shown in FIG. 3 requires another set of equations (see, for example, Johnson and Graham) known in the art, Eqs. 4–6, for the characteristic impedance:

$$Z_{0\,assymetric\,stripline} = \frac{2[Z_{stripline}(2H_1)][Z_{stripline}(2H_2)]}{Z_{stripline}(2H_1) + Z_{stripline}(2H_2)}, \quad (4)$$

where $$Z_{stripline}(X) = \frac{94.15}{\frac{W}{\frac{X+T}{1-\frac{T}{X+T}}} + \frac{\text{Geometry Factor}(X)}{\pi}} \frac{1}{\sqrt{\varepsilon_r}} \quad (5)$$

for X=2$H_1$ or 2$H_2$, and
Geometry Factor (X)=

$$\left[\left[\left[\frac{2}{1-\frac{T}{(X+T)}}\ln\left[\frac{1}{1-\frac{T}{(X+T)}}+1\right]\right] - \left[\left[\frac{1}{1-\frac{T}{(X+T)}}-1\right]\ln\left[\frac{1}{\left[1-\frac{T}{(X+T)}\right]^2}-1\right]\right]\right] \quad (6)$$

For the PCB 10 in FIG. 3, the prepreg layer 20 (thickness "H2") is shown adjacent or layered on the reference layer 16, the trace 24 is shown layered on the prepreg layer 20 and disposed (or embedded) between the prepreg layer 20 and the solder mask layer 28 (thickness "H1"). The conductive layer 30 on the solder mask layer 28 appears as having the same width (in the direction parallel to W) as the layers 28, 20, and 16 in FIG. 3. However, in accordance with an embodiment of the invention, the conductive layer 30 is adjacent to or layered on the solder mask layer 28 and offset from the trace 24 only on a limited region of the solder mask layer 28 in the vicinity of the trace 24. Thus, the conductive layer 30 may be much narrower than the layers 28, 20, and 16. Nevertheless, Eqs. 4–6, which are valid for the layers 30, 28, 20, and 16 being the same or approximately the same width, are also valid as long as the width of the conductive layer 30 is greater than or equal to the width of the trace 24, as in the present invention. Because the size of the conductive layer 30 is as wide, approximately as wide, or wider than the width of the trace 24, Eqs. 4–6 should be valid for the present invention. At least, Eqs. 4–6 should offer a reasonable approximation to a more exact calculation for the configuration in the present invention.

Proceeding with this assumption, for calculation of the characteristic impedance of the trace 24, further assumptions are: the trace 24 length (perpendicular to W and T, but not shown in the drawings) is 1 inch; the trace 24 (e.g., Cu) thickness T is 0.5 ounce (~0.7 mils); the prepreg layer 20 height H1 is 1.7 mils; the solder mask 28 height H2 is 5 mils; and the dielectric constant $\varepsilon r$ is 4.3 for both the prepreg layer 20 and the solder mask 28 (a reasonable assumption).

With the above assumptions, using Eqs. 4–6, if a desired characteristic impedance $Z_{0\,at}$ 1 MHz is 25 ohms, a value of approximately 25.1 ohms may be obtained for the trace 24 for a 5 mil trace width W. Other calculations known in the art may be used to show that, for the buried transmission line (i.e., trace 24), signal delay is 175.7 ps, inductance L is 4.4 nH, capacitance C is 7.0 pF, and the resistance per inch R is 0.201 ohms per inch.

Comparing the calculations for the microstrip and asymmetric stripline transmission lines, it appears that the microstrip trace 24' would have to be wider (e.g., 30 mils) than for the asymmetric stripline trace 24 (e.g., 5 mils) would have to be when a trace impedance of approximately 25 ohms may be an important design consideration for a PCB (e.g., a four-layer PCB). Thus, it is seen that the characteristic impedance of the trace (e.g., trace 24) may be tailored (reduced) to approximately 25 ohms from the typical 60–80 ohms by coating the PCB with the conductive layer 30 to allow the trace width to also be reduced.

As expected, the capacitance calculated is larger for the PCB 10 than the PCB 10' (e.g., 7.0 pF versus 6.4 pF). Moreover, the higher resistance per unit length for the stripline versus the microstrip results because of the smaller size (cross-sectional area) of the trace 24 than the trace 24', and indicates that more thermal dissipation ("$I^2R$" loss) may be expected with the stripline than the microstrip in this instance. The difference in resistance per unit length is, however, insignificant.

In view of the foregoing, use of the conductive layer 30 may indicate that more smaller width traces 24, for the same characteristic impedance, could be patterned on the PCB 10 than traces 24' on the PCB 10'. However, at least for the same inter-trace spacing, on the PCB 10, designs that increase the width of the traces 24, which have the offset conductive layer 30, could reduce the characteristic impedance of the traces 24 on the PCB 10 even further (e.g., to below 25 ohms), because the characteristic impedance is generally reduced as trace width increases. A tradeoff, therefore, may have to be made based on the number of traces required for a particular implementation, how much area they should occupy on the PCB, and what the impedance matching requirements are. Low characteristic impedance and small trace size may avoid the expense of adding layers to reduce impedance or adding more board real estate. Other impedance matching as well as other considerations may be important when trying to tailor characteristic impedance or trace size even further.

Figure 4:
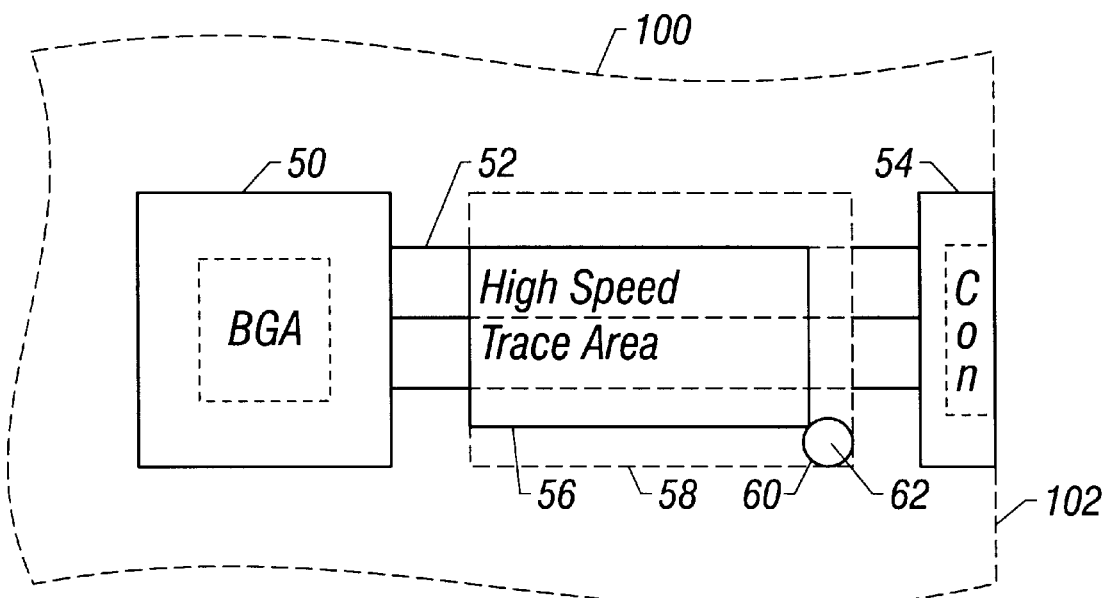
FIG. 4 shows a top view of a portion of a PCB in accordance with another embodiment of the invention.

As discussed above, the conductive layer 30 effects a distributed capacitance with the trace 24. Such a distributed capacitance may also be used to selectively tailor the characteristic impedance or trace size only in specific trace areas of the PCB 10 in accordance with an embodiment of the invention. Referring to FIG. 4 to illustrate this embodiment, a portion of a PCB 100 (having similar features and components to the PCB 10) is shown in a top view. The PCB 100 includes an integrated circuit 50, for example, a ball grid array ("BGA"). The BGA may be used to connect a DRAM controller. The integrated circuit 50 is coupled to a high speed trace area 52, which includes traces (e.g., traces similar to trace 24). A solder mask layer (not shown) similar to the solder mask layer 28 covers the integrated circuit 50 and the high speed trace area 52. The high speed traces in the high speed trace area 52 may be connected or coupled to a device (e.g., a connector) 54. The connector 54 could be an edge connector mounted to an edge 102 of the PCB 100, or it could be another type of connector. A conductive layer 56 similar to the conductive layer 30 may be adjacent to or layered on (coating the solder mask layer) the high speed trace area 52 as shown in FIG. 4. The conductive layer 56 may make one or more conductive contacts with, or be coupled to, an offset or lower lying ground (or reference plane) layer 58, for example, through a conductive through-hole 60 by a ground via 62. The ground layer 58, conductive through-hole 60, and ground via 62 may be similar to the ground layer 16, conductive through-hole 34, and ground via 32, respectively.

In this embodiment, the conductive layer 56 is adjacent to or layered on the solder mask in the vicinity of the high speed trace area 52 (i.e., it only substantially covers an area of the solder mask proximate the trace area 52) for targeted reduction of the characteristic impedance or size (width) of the traces within the high speed trace area 52. Such selective targeting of traces to offset coat (i.e., offset because of the intervening solder mask layer) with the conductive layer 56 enables only those offset coated traces to exhibit controlled, reduced characteristic impedance, or to be reduced in size for a given characteristic impedance (i.e., according to design), while not significantly affecting the characteristic impedance of traces in other areas of the PCB 100 that are outside of the trace area 52.

Figure 5:
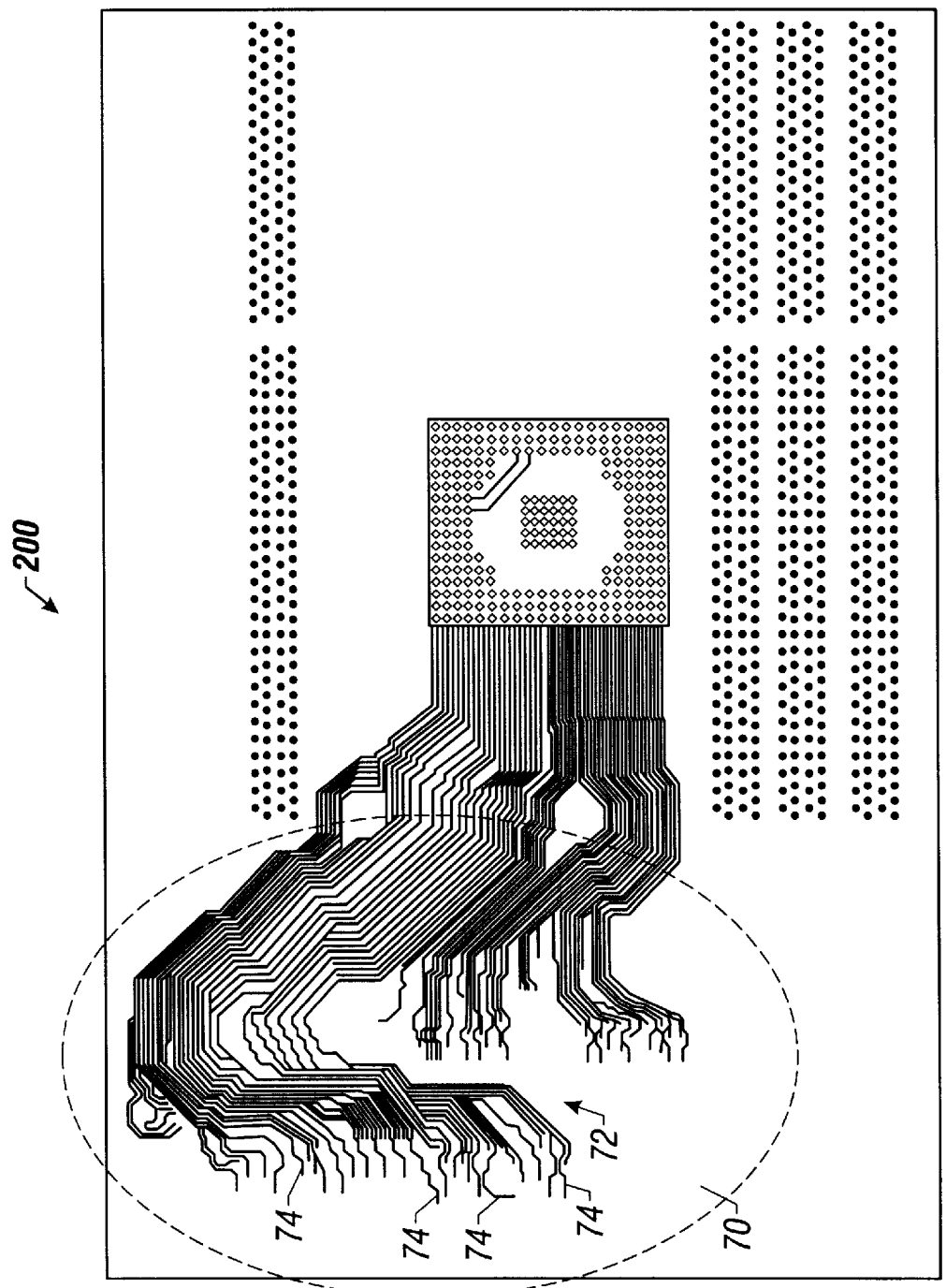
FIG. 5 shows a top view of a PCB in accordance with another embodiment of the invention.

In certain embodiments, the PCB 100 could be designed to include various conductive layers, like the conductive layer 56, which coat specific trace areas (similar to the trace area 52) to effect a different characteristic impedance depending on the PCB 100 design, the required trace width, spacing, and/or other implementation-specific requirements. An example of such specific targeting is shown in FIG. 5. In FIG. 5, a representation of the top of a PCB 200 (similar to the PCB 100) is shown in which a conductive layer 70 (similar to the conductive layer 56) is only applied adjacent to or layered on (i.e., coating a solder mask layer as for the PCB 100) a region 72 of traces 74 (similar to the trace area 52). The region 72 may include only high speed, high frequency traces. The layer 70 may be applied only to this controlled, selected, or limited area or region (or to a plurality of similar areas) proximate the trace area 72 and affect the characteristic impedance only for the particular traces 74 on the PCB 200 in analogy to the PCB 100. The conductive layer 70 may be used to control and reduce the characteristic impedance (or size) of only the traces 74 which it covers and not cover the whole PCB 200. Thus, analog chips and lower speed, lower frequency, or other traces may not be impacted by any change in characteristic impedance associated with coating proximate the traces 74.

Figure 6:
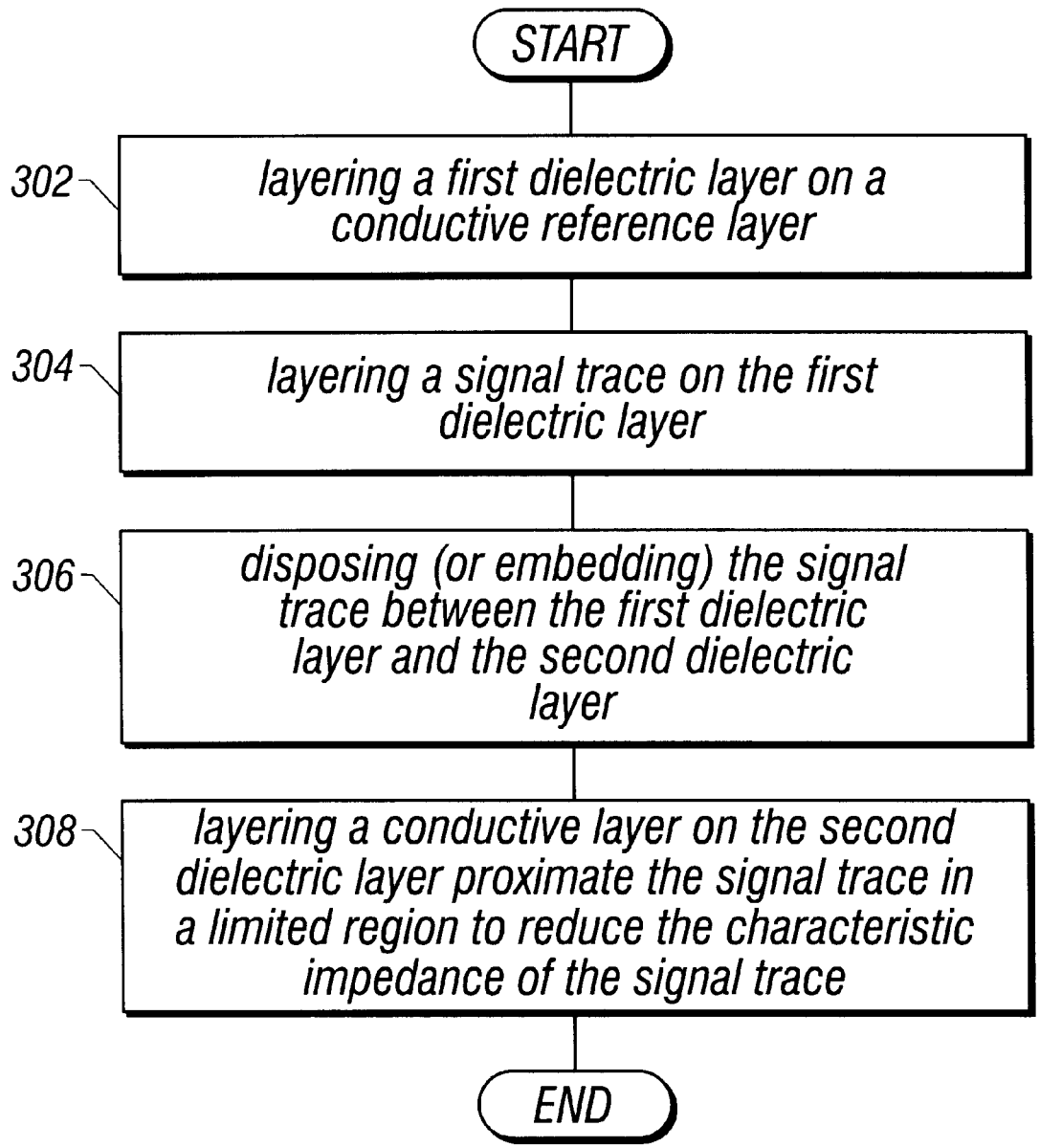
FIG. 6 is a flow chart representation of a method in accordance with another embodiment of the invention.

Specific methods of the present invention will now be discussed. FIG. 6 is a flowchart representation of a method in accordance with an embodiment of the invention. The method may be used to reduce, control (or tailor) signal trace characteristic impedance. The characteristic impedance of traces of smaller size may be tailored or reduced to values that would otherwise not be possible in multilayer circuit boards, such as the PCBs 10, 100, or 200, without using uncoated (i.e., no conductive layer) traces of larger size. The method includes: (1) layering a first dielectric layer on a conductive reference layer at block 302; (2) layering a signal trace on the first dielectric layer at block 304; (3) disposing (or embedding) the signal trace between the first dielectric layer and the second dielectric layer at block 306; and (4) layering a conductive layer on the second dielectric layer proximate the signal trace in a limited region to reduce, control (or tailor) the characteristic impedance of the signal trace at block 308. The method may also be used to tailor the size of a high-speed, high-frequency signal trace in a multilayer circuit board while allowing a low characteristic impedance of the signal trace. Moreover, the method may be used to tailor the size of high-speed, high-frequency signal traces while maintaining low characteristic impedance of the signal traces and allowing more signal traces to be included in the multilayer circuit board because of the tailored size. The conductive layer (e.g., layers 30, 56, or 70) could be applied in a post-processing step after standard or conventional construction and assembly of the multilayered circuit board (e.g., PCBs 10, 100, or 200), or it could be applied during standard or conventional assembly of the PCBs (e.g., as a last stage). Example application methods for the conductive layer could include stenciling, silk screening, or painting.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. A multilayered circuit board, comprising:
   a conductive reference layer;
   a first dielectric layer disposed on the conductive reference layer;
   a second dielectric layer;
   a signal trace disposed between the first dielectric layer and the second dielectric layer;
   a conductive epoxy layer disposed on a limited region of the second dielectric layer proximate the signal trace; and
   a conductive via passing through a conductive through-hole for coupling the conductive epoxy layer to the conductive reference layer;
   wherein the conductive epoxy layer reduces the characteristic impedance of the signal trace for a given signal trace width.

2. The circuit board of claim 1, wherein the circuit board comprises more than four layers.

3. The circuit board of claim 1, wherein the signal trace comprises a 1 MHz signal trace.

4. The circuit board of claim 1, wherein the circuit board is a four-layer circuit board.

5. The circuit board of claim 1, wherein the conductive epoxy layer comprises copper (Cu).

6. The circuit board of claim 1, wherein the conductive epoxy layer comprises silver (Ag).

7. The circuit board of claim 1, wherein the conductive epoxy layer comprises aluminum (Al).

8. The circuit board of claim 1, where in the conductive epoxy layer comprises metal.

9. The circuit board of claim 1, wherein the signal trace, the second dielectric layer, and the conductive epoxy form a buried transmission line.

10. The circuit board of claim 1, wherein the signal trace is embedded between the first dielectric layer and the second dielectric layer.

11. The circuit board of claim 1, further comprising additional signal traces embedded between the first dielectric layer and the second dielectric layer.

12. The circuit board of claim 11, wherein the conductive epoxy layer is proximate the additional signal traces.

13. The circuit board of claim 1, wherein the signal trace comprises a high-speed, high-frequency signal trace.

14. The circuit board of claim 1, wherein the conductive epoxy layer comprises a silk screened region.

15. The circuit board of claim 1, wherein the conductive epoxy layer is disposed on a limited region of the second dielectric layer proximate a trace area.

16. The circuit board of claim 1, further comprising a trace area embedded between the first dielectric layer and the second dielectric layer, wherein traces of the trace area are coupled to an integrated circuit.

17. The circuit board of claim 16, wherein the integrated circuit comprises a ball grid array.

18. The circuit board of claim 16, wherein the traces of the trace area are coupled to a connector.

19. A method of constructing a multilayer circuit board, comprising:

layering a first dielectric layer on a conductive reference layer;

layering a signal trace on the first dielectric layer;

layering a second dielectric layer on the signal trace;

layering a conductive epoxy layer on the second dielectric layer proximate the signal trace in a limited region to reduce the characteristic impedance of the signal trace for a given signal trace width; and forming a conductive via passing through the first dielectric layer and the second dielectric layer for coupling the conductive layer to the conductive reference layer.

20. The method of claim 19, further comprising disposing additional signal traces between the first dielectric layer and the second dielectric layer.

21. The method of claim 19, wherein layering of the conductive epoxy layer, the second dielectric layer and the signal trace forms a distributed capacitance.

22. The method of claim 19, wherein the signal trace is of smaller size than would otherwise be required for a given characteristic impedance without the layering of the conductive epoxy layer.

23. The method of claim 19, wherein the signal trace comprises a high-speed, high-frequency signal trace.

24. The method of claim 19, wherein layering of the signal trace comprises embedding the signal trace between the first dielectric layer and the second dielectric layer.

* * * * *